(12) United States Patent
Cheng et al.

(10) Patent No.: US 8,525,996 B2
(45) Date of Patent: Sep. 3, 2013

(54) LIGHT EMITTING COMPONENT MEASURING SYSTEM AND THE METHOD THEREOF

(75) Inventors: Hsu-Ting Cheng, Taoyuan Hsien (TW); I-Shih Tseng, Taoyuan Hsien (TW); Tsun-I Wang, Taoyuan Hsien (TW)

(73) Assignee: Chroma Ate Inc., Taoyuan Hsien (TW)

( * ) Notice: Subject to any disclaimer, the term of this patent is extended or adjusted under 35 U.S.C. 154(b) by 71 days.

(21) Appl. No.: 13/245,088

(22) Filed: Sep. 26, 2011

(65) Prior Publication Data

US 2012/0250021 A1    Oct. 4, 2012

(30) Foreign Application Priority Data

Apr. 14, 2011   (TW) .............................. 100112917 A (51) Int. Cl.
*G01N 21/25*   (2006.01)

(52) U.S. Cl.
USPC ......................................................... 356/418

(58) Field of Classification Search
USPC .................................................. 356/416–419
See application file for complete search history.

(56) References Cited

U.S. PATENT DOCUMENTS

2005/0036142 A1 *   2/2005   Oldham et al. ................ 356/344

* cited by examiner

*Primary Examiner* — Tarifur Chowdhury
*Assistant Examiner* — Abdullahi Nur
(74) *Attorney, Agent, or Firm* — Thomas|Horstemeyer, LLP (57) ABSTRACT

The invention discloses a light emitting component measuring system and the method thereof which is capable of measuring the optical proprieties of a plurality of the devices under test (DUT). Each DUT is capable of receiving electricity so as to output an initial ray, wherein each initial ray has a first wavelength range. The light emitting component measuring system comprises a filtering device and a sensing device. The filtering device comprises a first filtering portion which can filter a corresponding third wavelength of the said initial rays and output a plurality of first filtered rays simultaneously. Each first filtered ray has a second wavelength range respectively. The said sensing device receives the ray outputted from the filtering device and generates an optical data accordingly.

7 Claims, 12 Drawing Sheets

FIG. 1

(The prior art)

LIGHT EMITTING COMPONENT MEASURING SYSTEM AND THE METHOD THEREOF

CROSS-REFERENCE TO RELATED APPLICATION

This application claims priority to Taiwan Patent Application entitled "A Light Emitting Component Measuring System and The Method Thereof," having serial number 100112917, filed on Apr. 14, 2011, which is incorporated by reference in its entirety.

BACKGROUND OF THE INVENTION

1. Field of the Invention

The present invention refers to a light emitting component measuring system, and more particularly, to a light emitting component measuring system utilizing a filtering device for filtering and analyzing a plurality of light emitting components so as to obtain the optical proprieties of the light emitting components.

2. Description of the Prior Art

Figure 1:
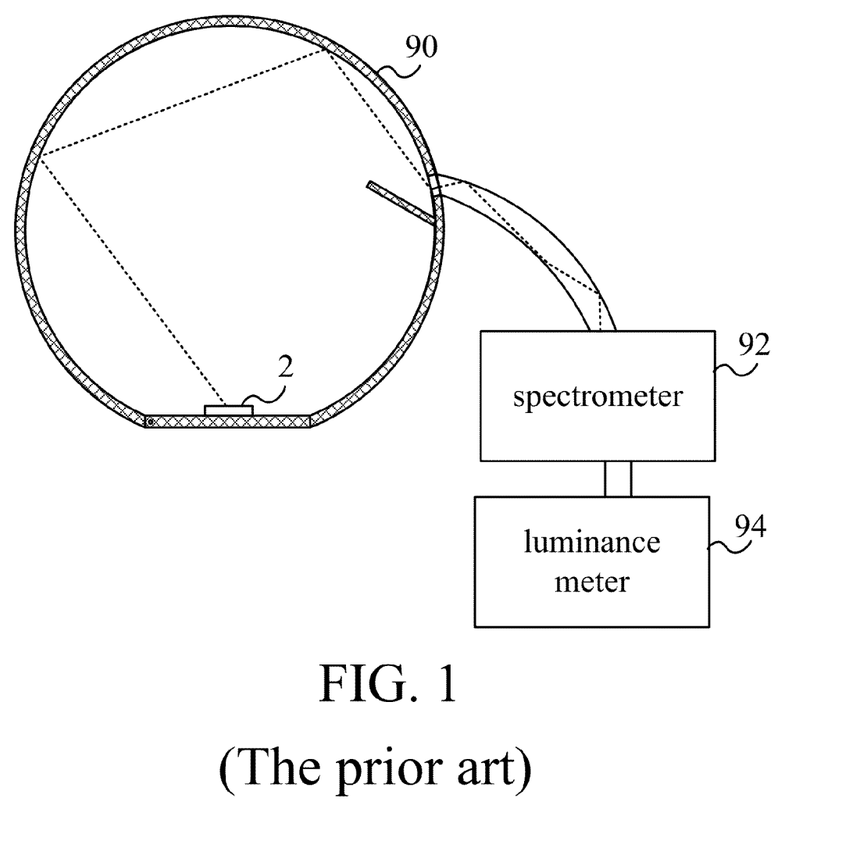
FIG. 1 is a schematic diagram of the prior art.

As the productivity of the light emitting component raised up, the demand of measuring the light emitting component has also increased. Please refer to FIG. 1, FIG. 1 is a schematic diagram of the prior art. The light emitting component measurement of the prior art utilizes an integrating sphere 90 cooperated with a spectrometer 92 and a luminance meter 94 to measure the total luminous flux and other optical proprieties such as a color temperature, a color rendering index or $CIE_{x,y}$ coordinates.

The integrating sphere 90 of the prior art is a hollow sphere with a highly reflective inner surface, which is an efficient device for collecting the ray emitted by the device under test (DUT) configured on the inside of sphere or a place near a certain window outside the sphere. The principle of the integrating sphere 90 comprises the following steps of: reflecting the light source reflected in a sphere with approximately 100% reflection rate; assuming the illuminance of each zone on the surface of the sphere is the same after several times of reflection; measuring the illuminance of one of the predetermined area accordingly and multiplying the area ratio between the predetermined area and the inside area of integrating sphere 90; and obtaining the total luminous flux of the light emitting component.

Moreover, the spectrometer 92 is a device for measuring the light source in a pre-predetermined wavelength range. The spectrometer 92 of the prior art comprises a dispersion component, such as an optical grating and a prism, for changing the light intensity to pass through the system. The principle of the spectrometer 92 comprises the following steps of: emitting a compound ray in the entrance slit of the spectrometer; transforming the compound ray into a parallel ray by an optical collimator; and passing the parallel ray through a diffraction grating for dispersing. In summary, the spectrometer 92 disperses light for further analyzing by the grating.

Therefore, each integrating sphere can measure only one light emitting component every time in theory. Moreover, the spectrometer is expensive and must cooperate with the integrating sphere. It leads to increase the cost of the measurement.

Moreover, there is a technology of utilizing the solar cell as a sensing component in the prior art. However, it can only analyze the light intensity, but the color temperature and the other optical proprieties of the light emitting component cannot be analyzed.

In view of the said problem in the prior art, therefore, how to develop a device and method which are cheap, efficient and able to measure the light intensity, the color temperature and the other optical proprieties of the light emitting component automatically, is the objective and direction need to be promoted in the industry.

SUMMARY OF THE INVENTION

In view of the said problem in the prior art, one scope of the present invention is to provide a light emitting component measuring system, for measuring the optical proprieties of a device under test (DUT), the DUT receives electricity and outputs an initial ray with a first wavelength range. The light emitting component measuring system of the present invention comprises a filtering device and a sensing device. The filtering device comprises a first filtering portion for filtering a third wavelength range of the initial ray and outputting a first filtered ray with a second wavelength range. The sensing device receives the first filtered ray outputted from the first filtering portion and generates a first data accordingly.

In actual practice, the light emitting component measuring system further comprises an optical device, configured between the DUT and the filtering device, for making the initial ray focus on the sensing device. Moreover, the optical device can also be configured between the filtering device and the sensing device, for making the initial ray focus on the sensing device.

In actual practice, the filtering device further comprises a second filtering portion for filtering a fifth wavelength range of the initial ray and outputting a second filtered ray with a fourth wavelength range, the fourth wavelength range is different to the second wavelength range. In addition, the filtering device comprises a rotating device for rotating the filtering device so as to switch between the locations of the first filtering portion and the second filtering portion. Moreover, the sensing device receives the second filtered ray outputted from the second filtering portion and generates a second data accordingly.

Moreover, the present invention can further comprise a calculating device, for generating the relative intensity-wavelength graph of the initial ray according to the first data and the second data.

In addition, in actual practice, the sensing device comprises a monochromatic charge-coupled device module or a monochromatic complementary metal-oxide-semiconductor module.

Moreover, another scope of the present invention is to provide a light emitting component measuring method, which comprises: preparing a device under test (DUT), the DUT receiving electricity and outputting an initial ray with a first wavelength range; filtering a third wavelength range of the initial ray and outputting a first filtered ray with a second wavelength range; measuring the first filtered ray so as to generate a first data; filtering a fifth wavelength range of the initial ray and outputting a second filtered ray with a fourth wavelength range; measuring the second filtered ray so as to generate a second data; and generating the relative intensity-wavelength graph of the initial ray according to the first data and the second data.

Moreover, in actual practice, the said method further comprising the following step: calculating an illuminance, a luminous flux, a color temperature, a color rendering index or $CIE_{x,y}$ coordinates of the DUT according to the relative intensity-wavelength graph of the initial ray.

Compared to the prior art, the present invention provides a system and method thereof which can measure a plurality of light emitting components simultaneously. In addition, the present invention make a filtering device to be integrated creatively in the measuring system, for utilizing various filtering conditions to filter the ray outputted from the DUT, and analyzing the various filtered ray so as to get a measuring result. The present invention increases the limit of the quantity every measure from one to a few dozen even several hundred, which makes the efficiency of the light emitting component measuring system raise a few dozen to several hundred times.

The objective of the present invention will no doubt become obvious to those of ordinary skill in the art after reading the following detailed description of the preferred embodiment, which is illustrated in following figures and drawings.

DETAILED DESCRIPTION OF THE INVENTION

Figure 2A:
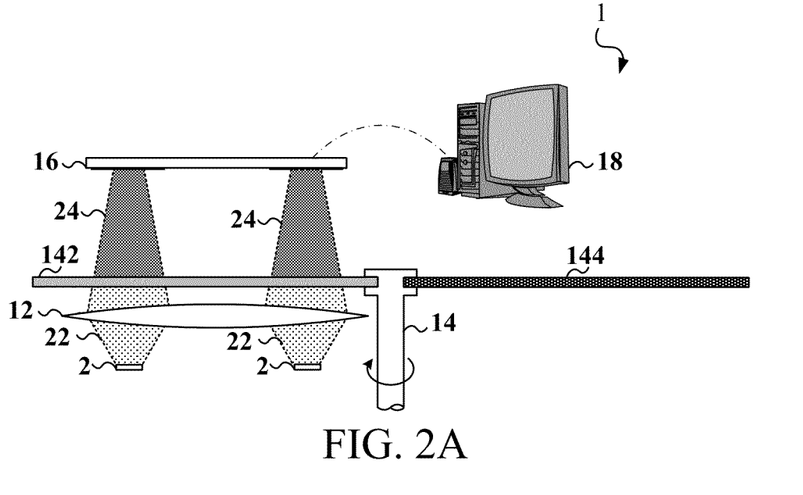
FIG. 2A is a schematic diagram of the light emitting component measuring system of an embodiment of the present invention.
Figure 3A:
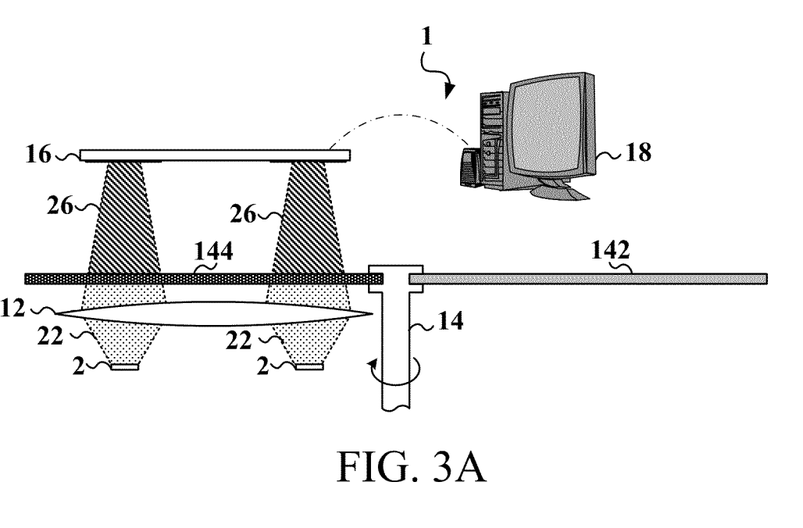
FIG. 3A is a schematic diagram of the light emitting component measuring system of an embodiment of the present invention.

Please refer to FIG. 2A and FIG. 3A. FIG. 2A and FIG. 3A are schematic diagrams of the light emitting component measuring system of an embodiment of the present invention. The light emitting component measuring system 1 is capable of measuring the optical proprieties of a plurality of devices under test (DUT) 2 simultaneously. Each DUT 2 is capable of receiving electricity so as to output an initial ray 22, wherein each initial ray has a first wavelength range 222. In the embodiment of the present invention, the light emitting component measuring system 1 comprises an optical device 12, a filtering device 14 and a sensing device 16.

In the embodiment of the present invention, the DUT 2 are configured on a carrier and set in the light emitting component measuring system 1. The plurality of DUT 2 receives electricity so as to output the initial ray 22 respectively. The plurality of initial rays 22 pass through the optical device 12 so as to make the initial rays 22 focus on the sensing device 16. As shown in FIG. 2A, each initial ray 22 is filtered by a first filtering portion 142 of the filtering device 14 and becomes a first filtered ray 24. The first filtered ray 24 corresponding to each DUT 2 is received by the corresponding sensing device 16 respectively. The sensing device 16 generates a first data respectively, wherein each first data is corresponding to each of the said DUT 2, and the first data is transmitted to a calculating device 18 for analyzing, so as to get the optical proprieties of a second wavelength range 224 of the initial ray 22. As shown in FIG. 3A, the filtering device 14 makes the switch to set a second filtering portion 144 on the DUT 2, each initial ray 22 is filtered by the second filtering portion 144 of the filtering device 14 and becomes a second filtered ray 26. The second filtered ray 26 corresponding to each DUT 2 is received by a corresponding sensing module of the sensing device 16 respectively. The sensing module generates a second data respectively, wherein each second data is corresponding to each of the said DUT 2, and the second data is transmitted to the calculating device 18 for analyzing, so as to get the optical proprieties of a fourth wavelength range 228 of the initial ray 22. The calculating device 18 is capable of obtaining the optical proprieties of the wavelength range of initial ray 22 of each DUT 2 through analyzing and calculating the first data and the second data of each DUT by a curve fitting and a multi-stage algorithm, and then summarizes an analysis data. The said analysis data can comprise an illuminance, a luminous flux, a color temperature, a color rendering index or $CIE_{x,y}$ coordinates, a pitch wavelength ($\lambda$p), a main wavelength ($\lambda$d) and a full width at half maximum (FWHM) of the DUT.

The DUT 2 refers to each of a light emitting component which can change electricity into light. In the embodiment of the present invention, the DUT 2 is an LED bare die. More specifically, DUT 2 is the LED bare die divided and neatly arranged from a wafer. However, the light emitting component is not limited to the LED bare die; the light emitting component can also be a laser diode chip, a uv diode chip or any other semiconductor element which can receive electricity so as to output a ray.

The optical proprieties of the said DUT 2 are the proprieties of the ray outputted from the DUT 2 which have received electricity, such as a luminous flux, a wavelength range, a relative intensity, a color temperature or $CIE_{x,y}$ coordinates of the ray. The said initial ray 22 is the ray generated by each DUT 2, and the initial ray 22 has a first wavelength range 222.

The optical device 12 is configured between the DUT 2 and the filtering device 14, for adjusting the focal distance of the ray in the system. In the embodiment of the present invention, the optical device 12 is configured between the plurality of DUT 2 and the filtering device 14, for adjusting the focal distance of each initial ray 22 outputted from the plurality of DUT 2 and making the focal distance of each initial ray 22 set on a corresponding surface of the said sensing device 16.

In the embodiment of the present invention, the optical device 12 is an arc lens. However, the optical device is not limited to the arc lens, the optical device can also be a microlens set or any other optical device with a function of adjusting the focal distance simultaneously. As the target is the initial ray, the first filtered ray or the second filtered ray, the optical device 12 is configured on the corresponding position between the DUT 2 and the filtering device 14.

The filtering device 14 filters the incident ray and outputs a filtered ray. The filtering device 14 only allows a ray within a predetermined wavelength range to pass, and a ray out of a predetermined wavelength will be reflected or absorbed by the filtering device 14.

In the embodiment of the present invention, the filtering device 14 is a color wheel. In general, the color wheel is the combination of the color separation filters in various wavelength ranges; the color wheel is capable of processing the color separation to the incident ray, and rotated by a rotating device (not shown in the figures) for separating various monochromatic light in order on the predetermined optical path so that the incident ray can be processed for the color separation and image formation of a color image, and be projected to a full-color image through the other components at last. In the embodiment of the present invention, the said rotating device is a high speed motor.

Compared to the color wheel of the prior art which is applied in color projector, large size color projection TV or optical projection device, the color wheel of the present invention filters the ray outputted from the DUT 2 and the unnecessary wavelength range of the ray outputted from the DUT 2 so as to capture the necessary wavelength range for measuring and analyzing, not for imaging.

Please refer to FIG. 2A and FIG. 3A again. In the embodiment of the present invention, the filtering device 14 comprises the first filtering portion 142 and the second filtering portion 144. The first filtering portion 142 filters the third wavelength range 226 of the first wavelength range 222 of each initial ray 22, and outputs the first filtered ray 24 with the second wavelength range 224. The size and value of the second wavelength range 224 is corresponding to the proprieties of the material used in the first filtering portion 142. Moreover, the second filtering portion 144 filters a fifth wavelength range 229 of the first wavelength range 222 of the initial ray 22, and outputs the second filtered ray 26 with the fourth wavelength range 228, wherein the fourth wavelength range 228 is different to the second wavelength range 224. Moreover, the filtering device 14 of the present invention is not limited to two filtering portions; as the requirement of the design, the filtering device 14 can have more than two filtering portions.

Figure 3B:
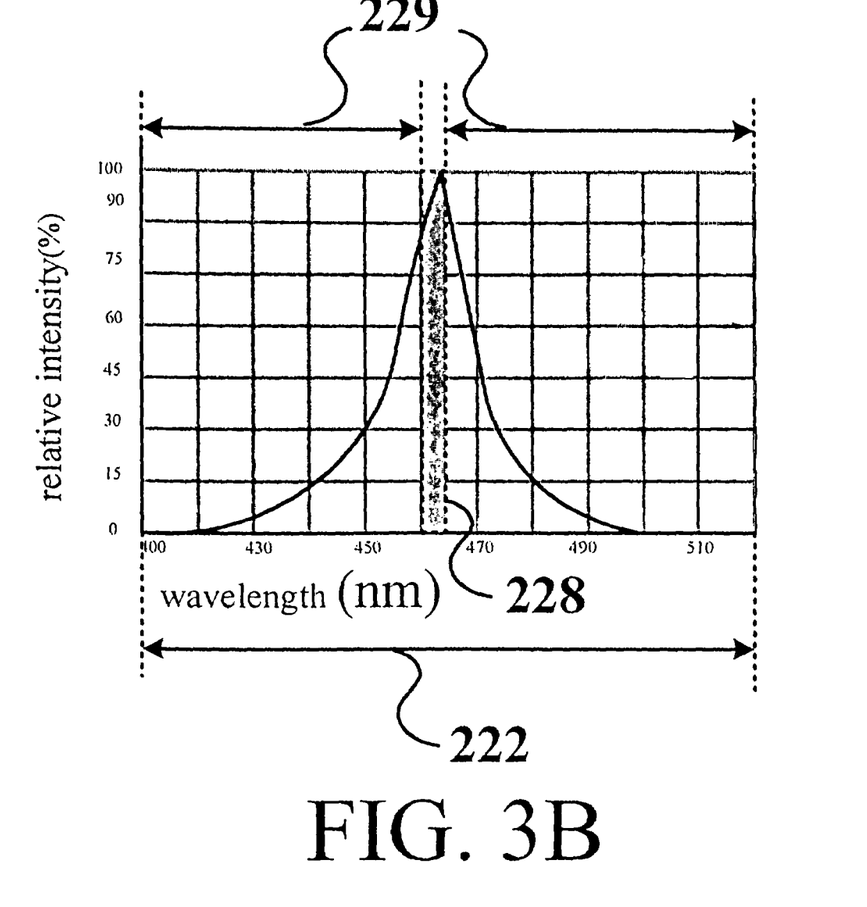
FIG. 3B is a relative intensity—wavelength graph of the initial ray of an embodiment of the present invention.
Figure 3C:
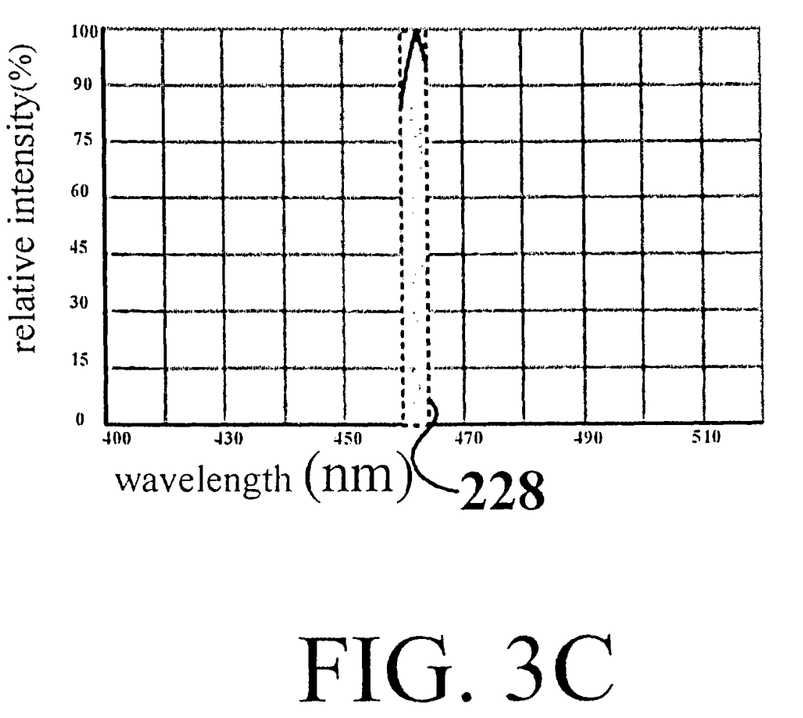
FIG. 3C is a relative intensity—wavelength graph of the first filtered ray of an embodiment of the present invention.
Figure 3D:
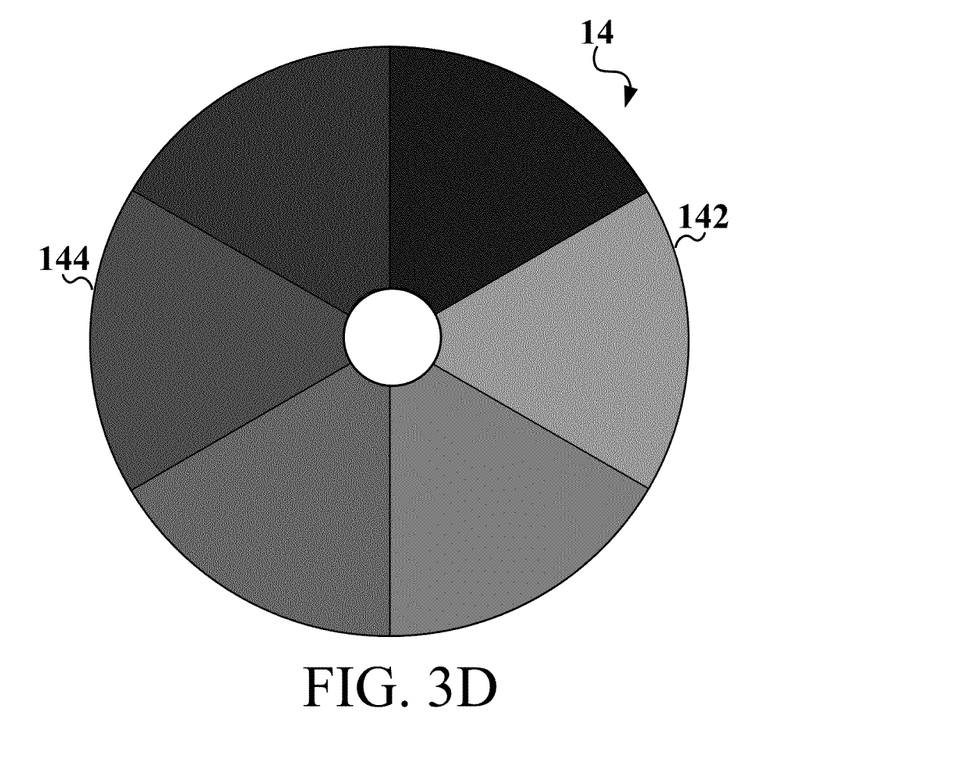
FIG. 3D is a top view of the filtering device of an embodiment of the present invention.

Please refer to FIG. 3D. FIG. 3D is a top view of the filtering device of an embodiment of the present invention. The filtering device 14 of the present invention comprises the first filtering portion 142 and the second filtering portion 144. In the embodiment of the present invention, the filtering device 14 comprises six filtering portions. However, the number of the filtering portion is not limited to six; as the requirement of the measurement, the filtering device can also comprises more than or less than six filtering portions, wherein the wavelengths for each filtering portion are different in general.

Moreover, the filtering device 14 of the present invention is not limited to the color wheel; as the requirement of the design, the filtering device can also utilize a plurality of filter glasses with different wavelength and the conventional switching mechanism to switch the filter glass with predetermined wavelength for filtering the ray with the corresponding wavelength.

Figure 2B:
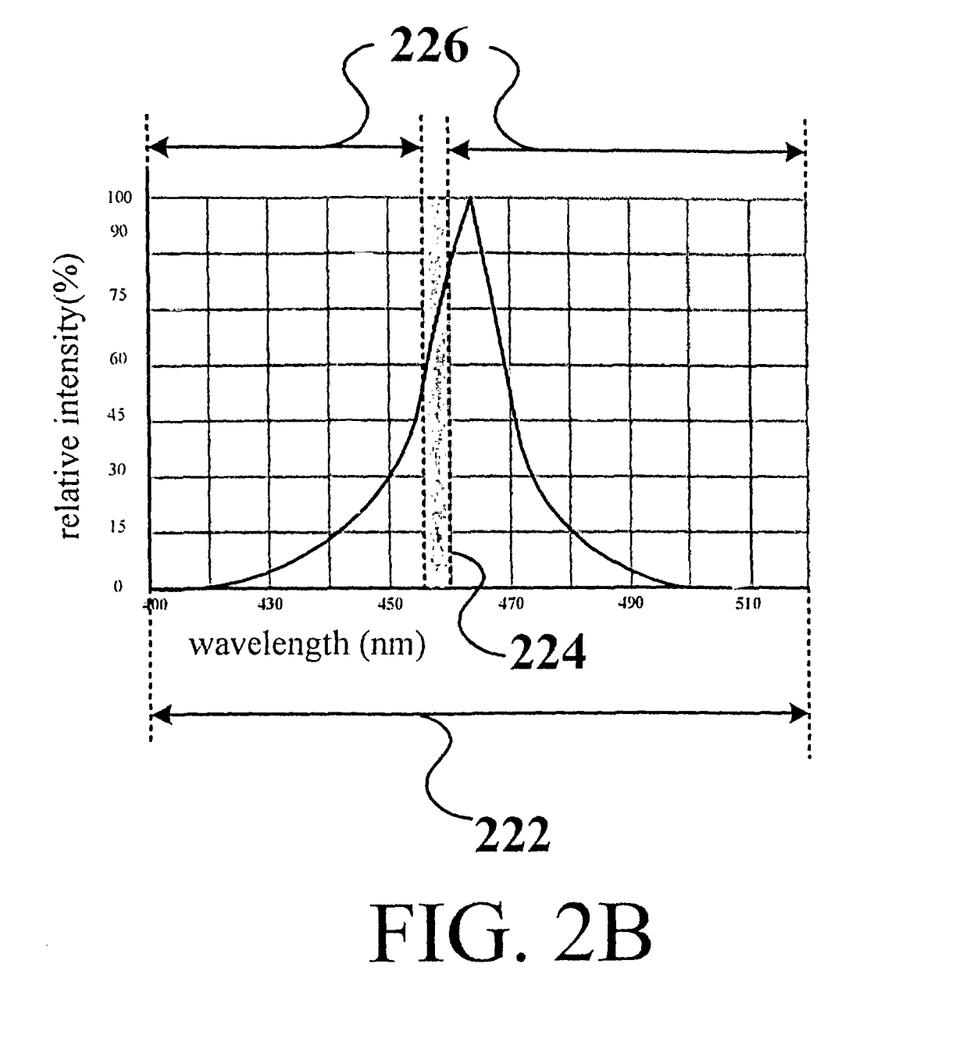
FIG. 2B is a relative intensity—wavelength graph of the initial ray of an embodiment of the present invention.
Figure 2C:
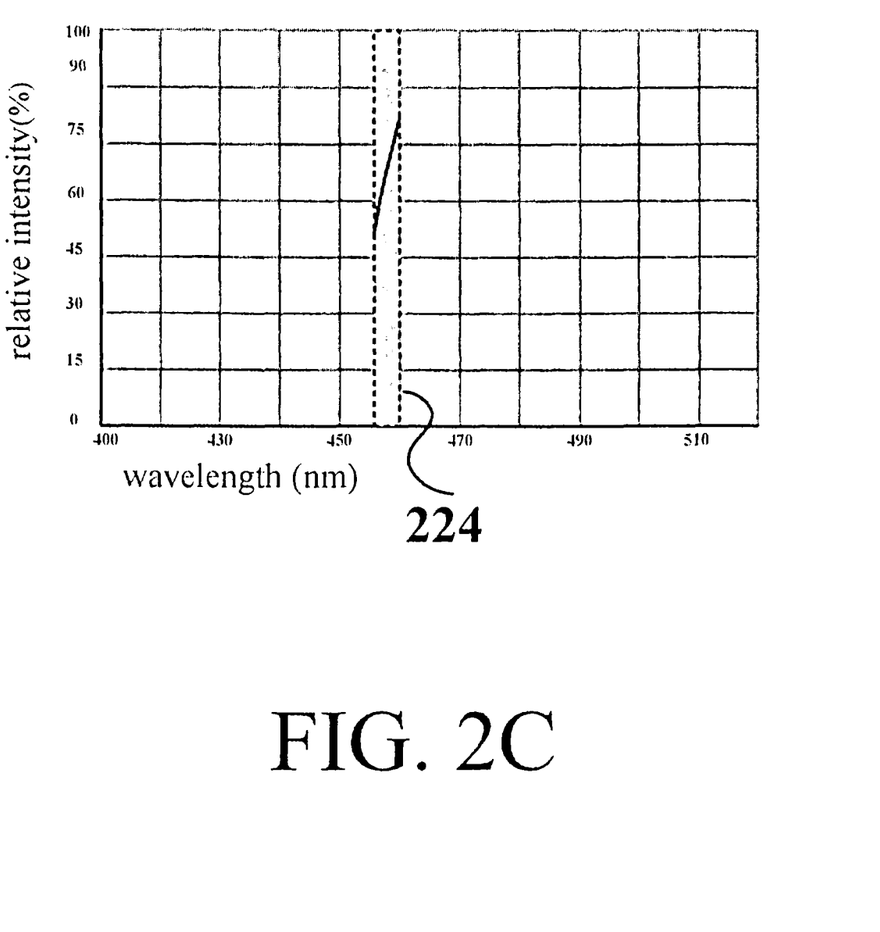
FIG. 2C is a relative intensity—wavelength graph of the first filtered ray of an embodiment of the present invention.

Please refer to FIG. 2B and FIG. 2C. FIG. 2B is a relative intensity—wavelength graph of the initial ray of an embodiment of the present invention. FIG. 2C is a relative intensity—wavelength graph of the first filtered ray of an embodiment of the present invention. In the embodiment of the present invention, the first wavelength range 222 is from 390 nm to 510 nm. The second wavelength range 224 is from 455 nm to 460 nm. The third wavelength range 226 is from 390 nm to 454 nm and 461 nm to 510 nm. As the initial ray 22 passes through the first filtering portion 142, the wavelength in the third range 226 will be filtered out for generating the first filtered ray 24. The wavelength range of the first filtered ray 24 is the wavelength range of the first wavelength range 222 minus the third wavelength range 226, which is equal to the second wavelength range 224. However, the size of the unit of each wavelength range is not limited to 5 nm; the size of the unit of the wavelength range is able to adjust freely.

Please refer to FIG. 3B and FIG. 3C. FIG. 3B is a relative intensity—wavelength graph of the initial ray of an embodiment of the present invention. FIG. 3C is a relative intensity—wavelength graph of the first filtered ray of an embodiment of the present invention. In the embodiment of the present invention, the first wavelength range 222 is from 390 nm to 510 nm. The fourth wavelength range 228 is from 460 nm to 465 nm, and the fifth wavelength range 229 is from 390 nm to 459 nm and 466 nm to 510 nm. As the initial ray 22 passes through the second filtering portion 144, the ray within the fifth wavelength range 229 will be filtered out for generating the second filtered ray 26. The wavelength range of the second filtered ray 26 is the wavelength range of the first wavelength range 222 minus the fifth wavelength range 229, which is equal to the fourth wavelength range 228.

The sensing device 16 receives the plurality of first filtered rays 24 and generates a plurality of corresponding optical data accordingly. In the embodiment of the present invention, the sensing device 16 comprises a sensing module. The sensing module is a monochromatic charge-coupled device module. In the embodiment of the present invention, each DUT 2 has a corresponding sensing module respectively, wherein each sensing module is in matrix arrangement. In addition, the said sensing module is not limited to the charge-coupled device module; it can also be a complementary metal-oxide-semiconductor module. Moreover, the said charge-coupled device module and complementary metal oxide semiconductor module are not limited to the monochromatic type; as the requirement of the design, it can also be color type. However, because the color sensing module consists of red, green and blue pixels, the resolution is one-third of the monochromatic sensing module for the fixed number of the pixels.

Figure 4:
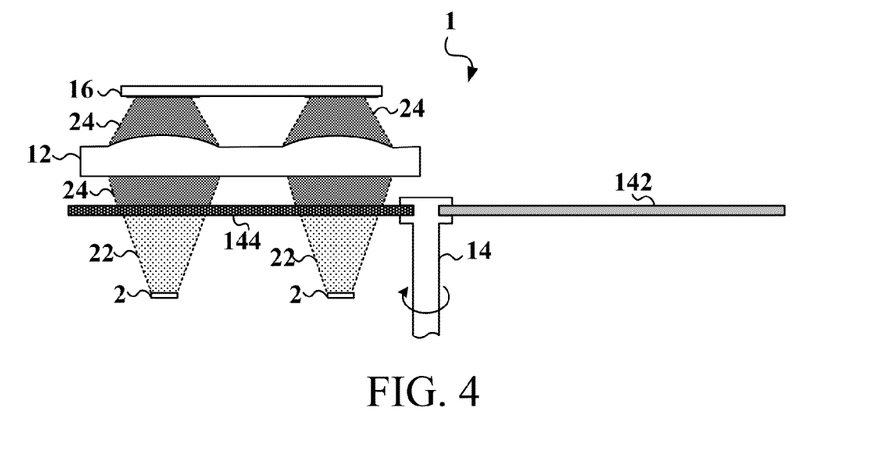
FIG. 4 is a schematic diagram of the light emitting component measuring system of another embodiment of the present invention.

Please refer to FIG. 4. FIG. 4 is a schematic diagram of the light emitting component measuring system of another embodiment of the present invention. In the embodiment of the present invention, the optical device 12 is configured between the filtering device 14 and the sensing device 16, for adjusting the focal distance of the ray outputted from the filtering device 14.

Figure 5:
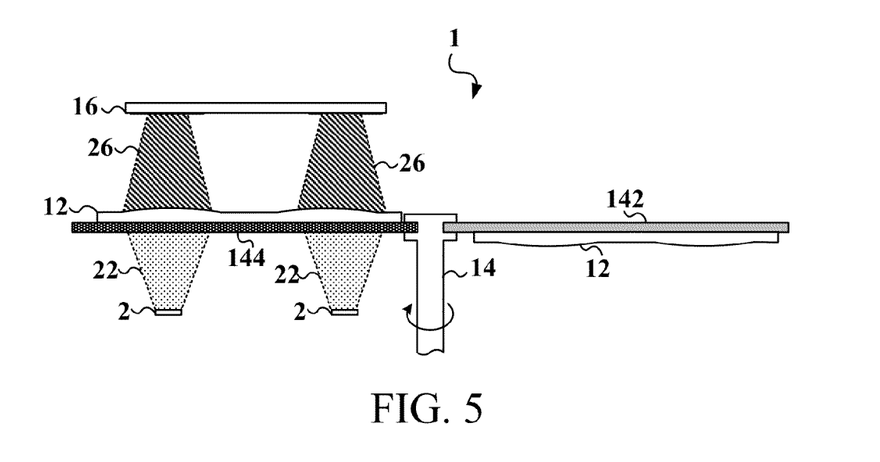
FIG. 5 is a schematic diagram of the light emitting component measuring system of another embodiment of the present invention.

Please refer to FIG. 5. FIG. 5 is a schematic diagram of the light emitting component measuring system of another embodiment of the present invention. In the embodiment of the present invention, the optical device 12 is configured on the top surface or the bottom surface of the filtering device 14, for adjusting the focal distance of the ray outputted from the filtering device 14. In addition, the optical device 12 can also combine with the filtering device 14 so as to reduce the number of components.

Figure 6:
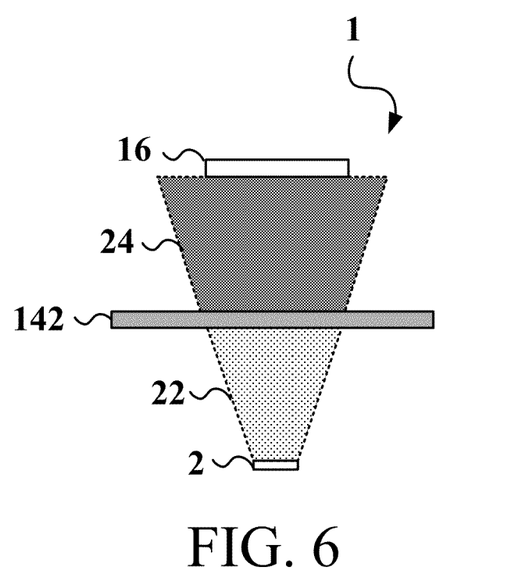
FIG. 6 is a schematic diagram of the light emitting component measuring system of another embodiment of the present invention.

Please refer to FIG. 6. FIG. 6 is a schematic diagram of the light emitting component measuring system of another embodiment of the present invention. In the embodiment of the present invention, the light emitting component measuring system 1 of the present invention is applied in the measuring of single DUT 2, and the optical device is selectively omitted. Owing to the divergence of the initial ray 22 of the DUT 2, the proportion of the ray which the DUT 2 losses is the same as the distance between the sensing device 16 and the DUT 2; therefore, the optical properties of the ray outputted from the DUT 2 are able to be obtained through adjusting the measuring result. Accordingly, in the embodiment of the present invention, the optical device is not necessary.

Figure 7:
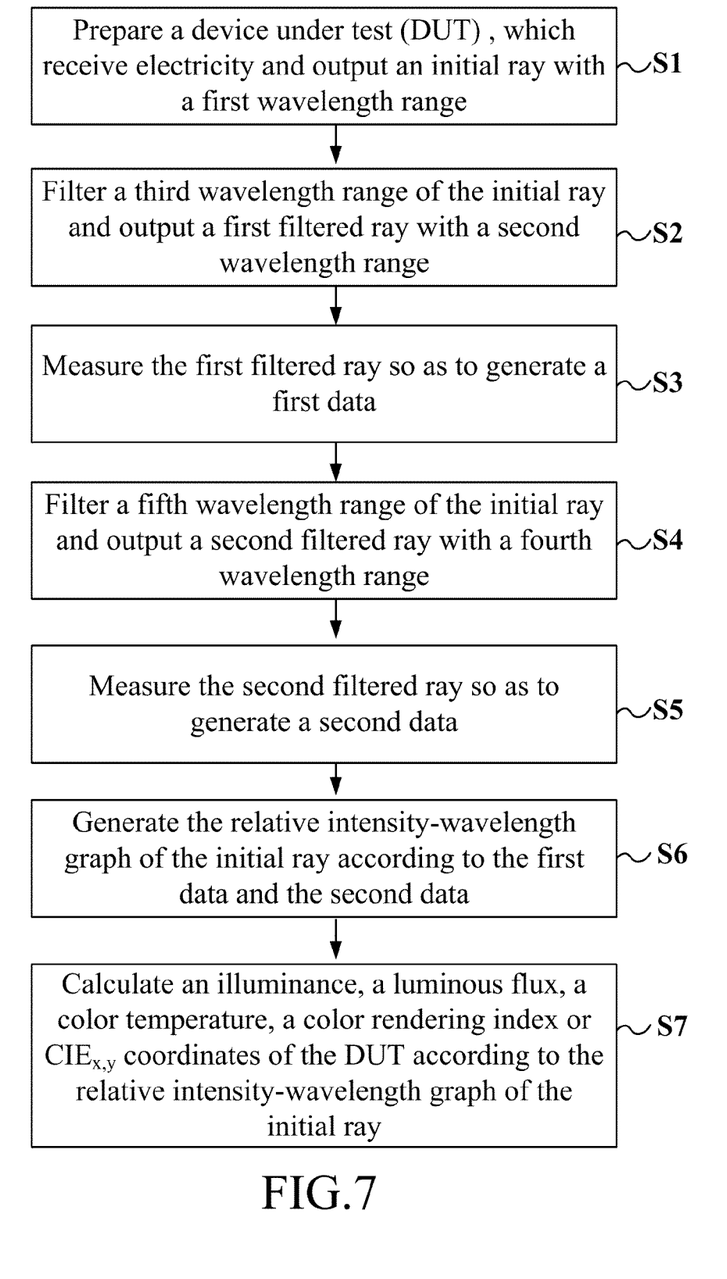
FIG. 7 is a flow diagram of the light emitting component measuring method of an embodiment of the present invention.

Please refer to FIG. 7. FIG. 7 is a flow diagram of the light emitting component measuring method of an embodiment of the present invention. The present invention provides a light emitting component measuring method additionally, which measures the optical proprieties of a plurality of DUT simultaneously. The method of the invention comprises the steps of S1 to S7, wherein the step of S1 is to prepare a device under test (DUT). The DUT receives electricity and outputs an initial ray with a first wavelength range. The step of S2 is to filter a third wavelength range of the initial ray and output a first filtered ray with a second wavelength range. The step of S3 is to measure the first filtered ray so as to generate a first data. The step of S4 is to filter a fifth wavelength range of the initial ray and output a second filtered ray with a fourth wavelength range. The step of S5 is to measure the second filtered ray so as to generate a second data. The step of S6 is to generate the relative intensity-wavelength graph of the initial ray according to the first data and the second data. The step of S7 is to calculate an illuminance, a luminous flux, a color temperature, a color rendering index or $CIE_{x,y}$ coordinates of the DUT according to the relative intensity-wavelength graph of the initial ray.

The said plurality of corresponding first data generated by measuring the plurality of first filtered rays are implemented by utilizing the sensing device of the said system to measure the first filtered ray, so that the sensing device generates the first data. The said plurality of corresponding second data generated by measuring the plurality of second filtered rays are implemented by utilizing the sensing device of the said system to measure the second filtered ray, so that the sensing device generates the second data. The said first data and second data can comprise a coordinate, a value or other text data.

In the embodiment of the present invention, the first data and the second data are the maximum coordinate values of the relative intensity of the second range and fourth range which belong to the first filtered ray and the second filtered ray. However, the first data and the second data are not limited to the said coordinate values. As the requirement of the user, it can also be the coordinate values or the corresponding values calculated by the minimum, the average or other calculation.

Figure 8:
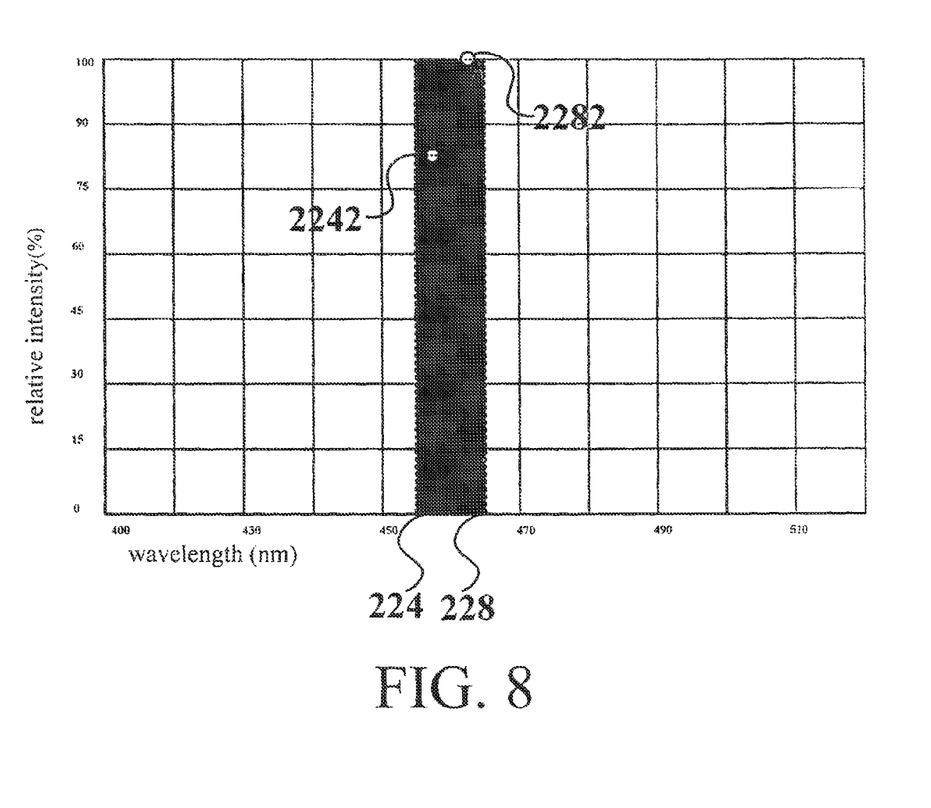
FIG. 8 is a schematic diagram of the analysis data of another embodiment of the present invention.

Please refer to FIG. 8. FIG. 8 is a schematic diagram of the analysis data of another embodiment of the present invention. In the embodiment of the present invention, after the coordinate values of the first data 2242 and the second data 2282 have been calculated according to the first filtered ray or the second filtered ray, the first data 2242 and the second data 2282 are arranged and summarized to the analysis data corresponding to the first filtered ray or the second filtered ray, so as to show the optical proprieties of each DUT for the user. The analysis data is the data obtained by analyzing the data comprised by the first data 2242 of first filtered ray or the second data 2282 of the second filtered ray.

In the embodiment of the present invention, the present invention utilizes the curve fitting and the multi-stage algorithm to analyze and calculate the first data 2242 and the second data 2282 of each DUT, so as to obtain the optical proprieties of each wavelength range of the initial ray of each DUT and summarize to an analysis data, wherein the said analysis data can comprise $CIE_{x,y}$ coordinates, a pitch wavelength ($\lambda p$), a main wavelength ($\lambda d$) and a full width at half maximum (FWHM) of the DUT. In the embodiment of the present invention, the analysis data is a relative intensity—wavelength graph. However, the analysis data is not limited to the elative intensity—wavelength graph; it can also be a text or image data comprising an illuminance, a luminous flux, a color temperature, a color rendering index or $CIE_{x,y}$ coordinates.

Compared to the prior art, the present invention provides a system and method thereof which can measure a plurality of light emitting components simultaneously. In addition, the present invention make a filtering device to be integrated creatively in the measuring system, for utilizing various filtering conditions to filter the ray outputted from the DUT, and analyzing the various filtered ray so as to get a measuring result. The present invention increases the limit of the quantity every measure from one to a few dozen even several hundred, which makes the efficiency of the light emitting component measuring system raise many times.

Although the present invention has been illustrated and described with reference to the preferred embodiment thereof, it should be understood that it is in no way limited to the details of such embodiment but is capable of numerous modifications within the scope of the appended claims.

What is claimed is:

1. A light emitting component measuring system, for measuring the optical proprieties of a device under test (DUT), the DUT receiving electricity and outputting an initial ray with a first wavelength range, the measuring system comprising:
   a filtering device, comprising:
      a first filtering portion for filtering a third wavelength range of the initial ray and outputting a first filtered ray with a second wavelength range; and
      a second filtering portion for filtering a fifth wavelength range of the initial ray and outputting a second filtered ray with a fourth wavelength range;
   a sensing device, for receiving the first filtered ray outputted from the first filtering portion and generating a first data accordingly, and for receiving the second filtered ray outputted from the second filtering portion and generating a second data accordingly; and
   a calculating device, for generating a relative intensity-wavelength graph of the initial ray according to the first data and the second data.

2. The light emitting component measuring system of claim 1, further comprising an optical device, configured between the DUT and the filtering device, for making the initial ray focus on the sensing device.

3. The light emitting component measuring system of claim 1, further comprising an optical device, configured between the filtering device and the sensing device, for making the initial ray focus on the sensing device.

4. The light emitting component measuring system of claim 1, wherein the filtering device comprises a rotating device for rotating the filtering device so as to switch between the locations of the first filtering portion and the second filtering portion.

5. The light emitting component measuring system of claim 1, wherein the sensing device comprises a monochromatic charge-coupled device module or a monochromatic complementary metal-oxide-semiconductor module.

6. A light emitting component measuring method, comprising:
   preparing a device under test (DUT), the DUT receiving electricity and outputting an initial ray with a first wavelength range;
   filtering a third wavelength range of the initial ray and outputting a first filtered ray with a second wavelength range;
   measuring the first filtered ray so as to generate a first data;

filtering a fifth wavelength range of the initial ray and outputting a second filtered ray with a fourth wavelength range;

measuring the second filtered ray so as to generate a second data; and generating a relative intensity-wavelength graph of the initial ray according to the first data and the second data.

7. The light emitting component measuring method of claim 6, further comprising the following step:

calculating an illuminance, a luminous flux, a color temperature, a color rendering index or $CIE_{x,y}$ coordinates of the DUT according to the relative intensity-wavelength graph of the initial ray.

* * * * *